United States Patent

Shibata et al.

[11] Patent Number: 5,122,215
[45] Date of Patent: Jun. 16, 1992

[54] METHOD OF PRODUCING ELECTRICALLY CONDUCTIVE ANISOTROPIC HEAT SEALING CONNECTOR MEMBERS

[75] Inventors: Mitsumasa Shibata, Kusatsu; Katsuhiro Murata; Tadaaki Isono, both of Ohtsu, all of Japan

[73] Assignee: Nippon Graphite Industries, Ltd., Ohtsu, Japan

[21] Appl. No.: 568,339

[22] Filed: Aug. 16, 1990

[30] Foreign Application Priority Data

Oct. 3, 1989 [JP] Japan .................. 1-257042

[51] Int. Cl.⁵ .............................. B32B 31/18
[52] U.S. Cl. ................. 156/250; 29/825; 29/831; 29/832; 359/88; 428/1
[58] Field of Search .......... 156/250; 29/825, 831, 29/832; 428/1; 350/330, 339 R

[56] References Cited

FOREIGN PATENT DOCUMENTS

| | | |
|---|---|---|
| 0134624 | 3/1985 | European Pat. Off. |
| 56-16921 | 4/1981 | Japan |
| 61-9342 | 3/1986 | Japan |
| 2048582 | 12/1980 | United Kingdom |
| 2222327 | 2/1990 | United Kingdom |

Primary Examiner—Caleb Weston
Attorney, Agent, or Firm—Ladas & Parry

[57] ABSTRACT

A method of producing electrically conductive anisotropic heat sealing connector members comprising, a process A of preparing an electrically conductive anisotropic suspension liquid type paint, applying the conductive paint on a surface of a flexible electrically insulative substrate film to form an electrically conductive circuit of longitudinal thin stripes pattern, and drying the applied conductive paint on the substrate film; a process B of preparing an electrically insulative heat-bonding suspension liquid type paint, applying the insulative paint wholly on the surface of the substrate film including both the longitudinal thin stripes pattern formed by the process A and the remaining portion of the substrate film, and drying the applied insulative paint on the substrate film to form a press heat bonding layer; and a process C of severing the applied and dried substrate film prepared by the processes A and B to desired length and width sizes to produce electrically conductive anisotropic heat sealing connector members.

1 Claim, 2 Drawing Sheets

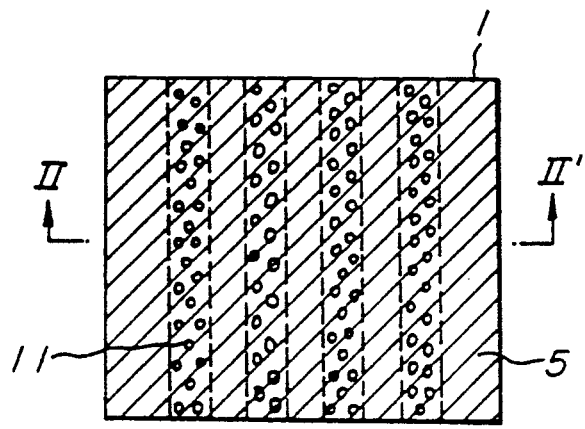
FIG_1
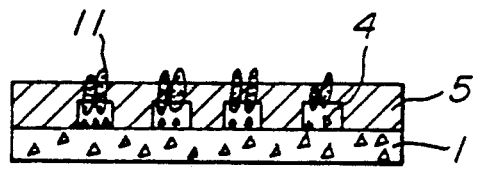
FIG_2
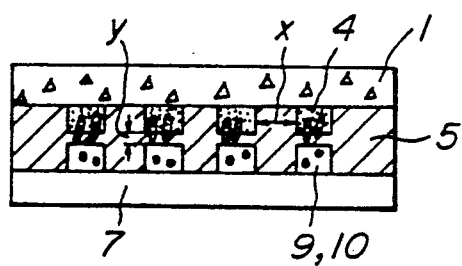
FIG_3

FIG_4
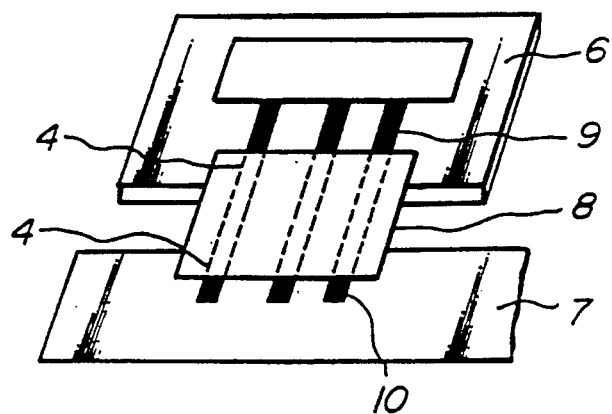
FIG_5
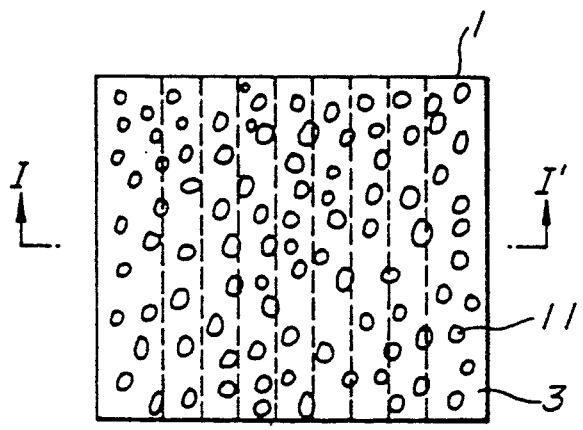
PRIOR ART
FIG_6
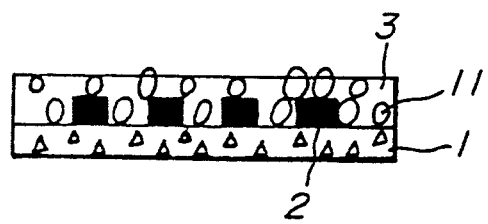
PRIOR ART

METHOD OF PRODUCING ELECTRICALLY CONDUCTIVE ANISOTROPIC HEAT SEALING CONNECTOR MEMBERS

BACKGROUND OF THE INVENTION

1. Field of the Invention

The present invention relates to a method of producing electrically conductive anisotropic heat sealing connector members, particularly which can cope with fine pitches of circuits patterns.

Such connector members or connector member will be referred to as "connector members" or "connector member", hereinafter.

The connector members are used for connecting the electrodes of liquid crystal display tubes, electrochromic display (ECD) panels or solar cells to the substrates of printed circuits and for connecting the terminals of the printed circuits to each other.

Such connector members are used in broad fields of use, such as, electric or electronic devices, chronometers, cameras, word processors, and computers, and the like.

2. Related Art Statement

Conventional electrically conductive anisotropic heat sealing connector members have electrically conductive anisotropic fillers 11 in the electrically conductive circuit patterns on a substrate film 1 and the remaining portion of the substrate film 1, as shown in FIG. 6. Because the anisotropic fillers 11 are existing on the remaining portion of the substrate film 1, as regards the electrical conductivity of the substrate film 11 in y direction, the weight proportion of the anisotropic fillers 11 can not be increased without damaging the electrical insulative property of the substrate film 1 in x direction.

SUMMARY OF THE INVENTION

An object of the present invention is to provide a method of producing electrically conductive anisotropic heat sealing connector members which can cope with fine pitches of circuits patterns, having splendid quality and high reliability.

Another object of the present invention is to provide a relatively simple and economical method of producing the connector members.

A further object of the present invention will become apparent from the ensuing descriptions and claims.

The present invention is a method of producing electrically conductive anisotropic heat sealing connector members, comprising, a process A including the steps of mixing (a) 10–60 wt % of at least one electrically conductive fine powder selected from the group consisting of graphite powder of grain sizes in a range of 0.1–60 μm, silver powder of grain sizes in a range of 0.1–60 μm, and carbon black powder of not over than 0.1 μm, (b) 5–30 wt % of at least one rubbery binder and/or thermal plastic resinous binder selected from the group consisting of chloroprene rubber, chlorosulfonated rubber, polyurethane resin, and polyester resin, (c) 30–50 wt % of at least one organic solvent selected from the group consisting of dimethylformamide, diacetonealcohol, isophoron, diethylcarbitol, butylcarbitol, and televin oil, and (d) 5–70 wt % of at least one electrically conductive fine powder selected from the group consisting of graphite powder, silver powder, copper powder, nickel powder, paradium powder, tin powder, solder powder, gold plated nickel powder, gold plated copper powder, gold plated tin powder, and electroless plated or gold plated micro resin spheres of styrene resin, ABS resin, AS resin or phenolic resin, respectively of grain sizes in a range of 1.0–50 μm, dissolving and uniformly dispersing the mixed components (a), (b), (c) and (d) to obtain an electrically conductive anisotropic suspension liquid type paint having an apparent specific gravity of 0.9–2.3 and a viscosity of 300–12,000 poise, applying the paint on a surface of a flexible electrically insulative substrate film by screen printing so as to form an electrically conductive circuit of longitudinal thin stripes pattern which serves to connect the electrode portion of a liquid crystal display tube, an ECD or a solar cell, or a printed circuit to the terminal portion of a printed circuit, and drying the applied paint on the substrate film by heating; a process B including the steps of mixing (e) 5–30 wt % of at least one powder selected from the group consisting of titanium oxide, talc, hydrated alumina, and colloidal silica, (f) 20–60 wt % of at least one thermal plastic resin series binder selected from the group consisting of synthetic chloroprene rubber, polyester resin, ethylene/vinylacetate copolymer resin, and polymethylmethacrylate resin, (g) 10–70 wt % of at least one organic solvent selected from the group consisting of isophoron, diacetonealcohol, methylisobutylketone, xylene, toluene, and diethylcarbitol, and (h) 0.1–20 wt % of at least one adhesion imparting agent (to be referred to as "adhesive agent", hereinafter) selected from the group consisting of terpen series resin and aliphatic hydrocarbon series resin, dissolving and uniformly dispersing the mixed components (e), (f), (g) and (h) to obtain an electrically insulative heat-bonding suspension liquid type paint having an apparent specific gravity of 0.8–1.4 and a viscosity of 150–5,000 poise, applying the paint wholly on the surface of the substrate film including both the longitudinal thin stripes pattern formed by the process A and the remaining portion of the substrate film by screen printing, drying the applied paint on the substrate film by heating to form a press heat bonding layer; a process C of severing the applied and dried substrate film prepared by the processes A and B to desired length and width sizes to produce substrate chips; and a process D of contacting an end of the electrically conductive circuit of the press heat bonding layer of the substrate chips obtained by the process C to the electrode of a liquid crystal display tube, an ECD or a solar cell, or a terminal portion of a printed circuit, while contacting the other end of the electrically conductive circuit of the press heat bonding layer of the substrate chips to the terminal portion of a printed circuit, press heat bonding the both ends of the substrate chips at a temperature of 100°–200° C. and a pressure of 10–70 kg/cm² to make them integral with the contacted portions, respectively.

The electrically conductive anisotropic heat sealing connector members for coping with fine pitches of circuits patterns of the present invention have the electrically conductive anisotropic fillers 11 exclusively in the electrically conductive circuits 4, as shown in FIG. 2, so that an electrically conductive anisotropic fillers 11 do not exist on the remaining portion of the substrate film 1, and the press heat bonding electrically insulative layer 5 exists solely on the remaining portion of the substrate film 1.

By this arrangement, the connector member can have further improved high reliability than that of conventional connector member, and more satisfactorily and assuredly cope with fine pitches of circuits patterns 4. This is due to the electrically conductive anisotropic property of the electrically conductive anisotropic circuit 4, as shown in FIG. 3. In the present invention, as regards the electrical insulative property in x direction of the substrate film 1, an electrically conductive anisotropic fillers 11 do not exist on the remaining portion of the substrate film 1, so that exceedingly high electrical insulative property of the substrate film 1 can be obtained. Meanwhile, as regards the electrically conductive property of the substrate film 1 in y direction, the weight proportion of the electrically conductive anisotropic fillers 11 can be increased, so that more splendid electrically conductive property can be exhibited.

The connector member of the present invention can also cope with rough pitches of circuits patterns.

BRIEF DESCRIPTION OF THE DRAWINGS

For a better understanding of the present invention, reference is made to the accompanying drawings, in which:

FIG. 1 is an enlarged front view of an embodiment of the present invention;

FIG. 2 is an enlarged cross-sectional view thereof along the line II—II;

FIG. 3 is an explanational enlarged cross-sectional view of the main portion of the present connector member after press heat bonded;

FIG. 4 is a perspective schematic view of a used state of the present connector member;

FIG. 5 is an enlarged front view of a prior connector member; and

FIG. 6 is an enlarged cross-sectional view thereof along the line I—I.

NUMBERINGS IN THE DRAWINGS

1 . . . flexible electrically insulative substrate film
2 . . . electrically conductive circuit
3 . . . electrically conductive anisotropic press heat bonding layer
4 . . . electrically conductive anisotropic circuit
4' . . . electrically conductive circuit consisting of applied material
5 . . . electrically insulative press heat bonding layer
6 . . . various display, such as, liquid crystal display tube
7 . . . printed circuit substrate
8 . . . an embodiment of the present connector member
9 . . . electrode portion of the display 6
10 . . . terminal portion of the printed circuit substrate 7
11 . . . electrically conductive anisotropic fillers

DESCRIPTION OF THE PREFERRED EMBODIMENTS

Hereinafter, the present invention will be explained in more detail with reference to examples.

EXAMPLE 1

In the process A, the following components are used:

| | | |
|---|---|---|
| (a) | graphite powder of grain sizes of 0.1–60 μm | 25 wt % |
| | carbon black of not over than 0.1 μm | 5 wt % |
| (b) | chloroprene rubber | 15 wt % |
| (c) | isophoron | 30 wt % |
| | diacetone.alcohol | 5 wt % |
| (d) | gold plated nickel powder of grain sizes of 20–40 μm | 20 wt % |

In the process B, the following components are used:

| | | |
|---|---|---|
| (e) | titanium oxide | 10 wt % |
| (f) | synthetic chloroprene rubber | 45 wt % |
| (g) | xylene | 25 wt % |
| | methylisobutylketone | 10 wt % |
| | isophoron | 7.5 wt % |
| (h) | terpen series resin | 2.5 wt % |

In the process C, the length and width of the substrate chips are 100 mm and 3.0 mm, respectively.

In the process D, an electrode terminal portion 9 a liquid crystal display tube having a pitch of 0.35 mm is connected to a terminal 10 of a printed circuit substrate having a pitch of 0.35 mm with the aid of the present connector member 8 at a press heat bonding condition of a temperature of 180° C. and a pressure of 30 kg/cm$^2$.

By effecting the processes A, B, C and D under the above described conditions, the connector members of the present invention were obtained. The connector members were sufficiently usable in practical uses, as shown in FIG. 4.

EXAMPLE 2

In the process A, the following components are used;

| | | |
|---|---|---|
| (a) | graphite powder of grain sizes of 0.1–60 μm | 30 wt % |
| | carbon black of not over than 0.1 μm | 5 wt % |
| (b) | polyurethane resin | 20 wt % |
| (c) | isophoron | 20 wt % |
| | dimethyl formamide | 5 wt % |
| (d) | gold plated nickel powder of grain sizes of 20–40 μm | 20 wt % |

In the process B, the following components are used;

| | | |
|---|---|---|
| (e) | titanium oxide | 10 wt % |
| (f) | polyester resin | 45 wt % |
| (g) | diacetone.alcohol | 30 wt % |
| | methylisobutylketone | 10 wt % |
| (h) | terpen series resin | 5 wt % |

In the process C, the length and width of the substrate chips are 50 mm and 45 mm, respectively.

In the process D, an electrode terminal portion 9 of a liquid crystal display tube having a pitch of 0.4 mm is connected to a terminal 10 of a printed circuit substrate having a pitch of 0.4 mm with the aid of the present connector member 8 at a press heat bonding condition of a temperature of 160° C. and a pressure of 25 kg/cm$^2$.

EXAMPLE 3

In the process A, the following components are used:

| | | |
|---|---|---|
| (a) | graphite powder of grain sizes of 0.1–60 μm | 40 wt % |
| (b) | chlorosulfonated rubber | 20 wt % |
| (c) | isophoron | 15 wt % |
| | diacetone.alcohol | 5 wt % |
| (d) | paradium powder of grain sizes of 20–40 μm | 20 wt % |

In the process B, the following components are used:

| (e) titanium oxide | 10 wt % |
|---|---|
| (f) synthetic chloroprene rubber | 45 wt % |
| (g) xylene | 25 wt % |
| methylisobutylketone | 10 wt % |
| isophoron | 7.5 wt % |
| (h) terpen series resin | 2.5 wt % |

In the process C, the length and width of the substrate chips are 20 mm and 120 mm, respectively.

In the process D, an electrode terminal portion 9 of a liquid crystal display tube having a pitch of 0.35 mm is connected to a terminal 10 of a printed circuit substrate having a pitch of 0.35 mm with the aid of the present connector member 8 at a press heat bonding condition of a temperature of 180° C. and a pressure of 35 kg/cm².

EXAMPLE 4

In the process A, the same components as those of Example 1 are used. In the process B, the same components as those of Example 2 are used.

In the process C, the length and width of the substrate chips are 50 mm and 45 mm, respectively.

In the process D, terminal portions of two printed circuit substrates having a pitch of 0.3 mm are connected to each other with the aid of the present connector member 8 at a press heat bonding condition of a temperature of 170° C. and a pressure of 30 kg/cm².

EXAMPLE 5

In the process A, the following components are used;

| (a) silver powder of grain sizes of 0.1–60 μm | 55 wt % |
|---|---|
| (b) chloroprene rubber | 7 wt % |
| (c) isophoron | 10 wt % |
| diacetone.alcohol | 8 wt % |
| (d) gold plated nickel powder of grain sizes of 20–40 μm | 20 wt % |

In the process B, the same components as those of Example 1 are used.

In the process C, the length and width of the substrate chips are 30 mm and 70 mm, respectively.

In the process D, similarly as in the case of Example 1, an electrode terminal portion 9 of a liquid crystal display tube having a pitch of 0.35 mm is connected to a terminal 10 of a printed circuit substrate having a pitch of 0.35 mm with the aid of the present connector member 8 at a press heat bonding condition of a temperature of 180° C. and a pressure of 40 kg/cm².

EXAMPLE 6

In the process A, the following components are used;

| (a) silver powder of grain sizes of 0.1–60 μm | 50 wt % |
|---|---|
| (b) polyurethane resin | 10 wt % |
| (c) isophoron | 10 wt % |
| diacetone.alcohol | 10 wt % |
| (d) gold plated nickel powder of grain sizes of 20–40 μm | 20 wt % |

In the process B, the same components as those of Example 2 are used.

In the process C, the length and width of the substrate chips are 20 mm and 60 mm, respectively.

In the process D, terminal portions of two printed circuit substrates having a pitch of 0.3 mm, similarly as in the case of Example 4, are connected to each other with the aid of the present connector member 8 at a press heat bonding condition of a temperature of 170° C. and a pressure of 30 kg/cm².

EXAMPLE 7

In the process A, the following components are used;

| (a) silver powder of grain sizes of 0.1–60 μm | 45 wt % |
|---|---|
| graphite powder of grain sizes of 0.1–60 μm | 10 wt % |
| (b) chloroprene rubber | 7 wt % |
| (c) isophoron | 10 wt % |
| diacetone.alcohol | 8 wt % |
| (d) gold plated nickel powder of grain sizes of 20–40 μm | 20 wt % |

In the process B, the same components as those of Example 1 are used.

In the process C, the length and width of the substrate chips are 30 mm and 50 mm, respectively.

In the process D, an electrode terminal portion 9 of a liquid crystal display tube having a pitch of 0.35 mm is connected to a terminal 10 of a printed circuit substrate having a pitch of 0.35 mm with the aid of the present connector member 8 at a press heat bonding condition of a temperature of 180° C. and a pressure of 35 kg/cm².

The method of the present invention can be quite easily and simply practiced into effect, so that the present invention is eminently useful in industry.

As explained in detail in the forgoings, according to the present invention, an excellent method is provided of producing the connector members having splendid quality and high reliability.

Although the present invention has been described with reference to specific examples and numerical values, it should be understood that the present invention is not restricted to such examples and numerical values, and numerous changes and modifications are possible without departing from the broad spirit and the aspect of the present invention as defined in the appended claims.

What is claimed is:

1. A method of producing electrically conductive anisotropic heat sealing connector members, comprising, a process A including the steps of mixing (a) 10–60 wt % of at least one electrically conductive fine powder selected from the group consisting of graphite powder of grain sizes in a range of 0.1–60 μm, silver powder of grain sizes in a range of 0.1–60 μm, and carbon black powder of not over than 0.1 μm, (b) 5–30 wt % of at least one rubbery binder and/or thermal plastic resinous binder selected from the group consisting of chloroprene rubber, chlorosulfonated rubber, polyurethane resin, and polyester resin, (c) 30–50 wt % of at least one organic solvent selected from the group consisting of dimethylformamide, diacetonealcohol, isophoron, diethylcarbitol, butylcarbitol and televin oil, and (d) 5–70 wt % of at least one electrically conductive fine powder selected from the group consisting of graphite powder, silver powder, copper powder, nickel powder, paradium powder, tin powder, solder powder, gold plated nickel powder, gold plated copper powder, gold plated tin powder, and electroless plated or gold plated micro resin spheres of styrene resin, ABS resin, AS resin or phenolic resin, respectively of grain sizes in a range of 1.0–50 μm, dissolving and uniformly dispersing the mixed components (a), (b), (c) and (d) to obtain an electrically conductive anisotropic suspension liquid type paint having an apparent specific gravity of 0.9–2.3 and a viscosity of 300–12,000 poise, applying the electrically conductive paint on a surface of a flexible electrically insulative substrate film by screen printing so as to form an electrically conductive circuit of longitudinal thin stripes pattern which serves to connect the electrode portions of a liquid crystal display tube, an ECD or a solar cell, or a printed circuit, to terminal portions of a printed circuit, and drying the applied electrically conductive paint on the substrate film by heating; a process B including the steps of mixing (e) 5–30 wt % of at least one powder selected from the group consisting of titanium oxide, talc, hydrated alumina, and colloidal silica, (f) 20–60 wt % of at least one thermal plastic resin series binder selected from the group consisting of synthetic chloroprene rubber, polyester resin, ethylene/vinylacetate copolymer resin, and polymethylmethacrylate resin, (g) 10–70 wt % of at least one organic solvent selected from the group consisting of isophoron, diacetonealcohol, methylisobutylketone, xylene, toluene, and diethylcarbitol, and (h) 0.1–20 wt % of at least one adhesion imparting agent selected from the group consisting of terpen series resin and aliphatic hydrocarbon series resin, dissolving and uniformly dispersing the mixed components (e), (f), (g), and (h) to obtain an electrically insulative heat-bonding suspension liquid type paint having an apparent specific gravity of 0.8–1.4 and a viscosity of 150–15,000 poise, applying the electrically insulative paint wholly on the surface of the substrate film including both the longitudinal thin stripes pattern formed by the process A and the remaining portion of the substrate film by screen printing, during the applied electrically insulative paint on the substrate film by heating to form a press heat bonding layer; and a process C of severing the applied and dried substrate film prepared by the processes A and B to desired length and width sizes to produce electrically conductive anisotropic heat sealing connector members.

* * * * *